(12) United States Patent
Nakamura et al.

(10) Patent No.: US 11,879,654 B2
(45) Date of Patent: Jan. 23, 2024

(54) TRANSMISSION DEVICE, AIR-CONDITIONING APPARATUS, AND AIR-CONDITIONING SYSTEM

(71) Applicant: Mitsubishi Electric Corporation, Tokyo (JP)

(72) Inventors: Ken Nakamura, Tokyo (JP); Takayoshi Kubo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 652 days.

(21) Appl. No.: 17/053,096

(22) PCT Filed: Jul. 11, 2018

(86) PCT No.: PCT/JP2018/026198
§ 371 (c)(1),
(2) Date: Nov. 5, 2020

(87) PCT Pub. No.: WO2020/012580
PCT Pub. Date: Jan. 16, 2020

(65) Prior Publication Data
US 2021/0140667 A1    May 13, 2021

(51) Int. Cl.
*H02H 3/00* (2006.01)
*F24F 11/56* (2018.01)
(Continued)

(52) U.S. Cl.
CPC ............ *F24F 11/56* (2018.01); *F24F 1/0007* (2013.01); *F24F 1/06* (2013.01); *F24F 3/00* (2013.01);
(Continued)

(58) Field of Classification Search
None
See application file for complete search history.

(56) References Cited

U.S. PATENT DOCUMENTS

| 9,306,755 B2 * | 4/2016 | Borchers | ................ H04L 12/10 |
| 2003/0039267 A1 * | 2/2003 | Koo | ...................... H04W 52/48 |
| | | | 370/465 |

(Continued)

FOREIGN PATENT DOCUMENTS

| JP | H04-160842 A | 6/1992 |
| JP | 2011-176436 A | 9/2011 |

OTHER PUBLICATIONS

International Search Report of the International Searching Authority dated Sep. 18, 2018 for the corresponding international application No. PCT/JP2018/026198 (and English translation).

*Primary Examiner* — Stephen W Jackson
(74) *Attorney, Agent, or Firm* — POSZ LAW GROUP, PLC

(57) ABSTRACT

Provided is a transmission device for transmitting and receiving data through a transmission channel. The transmission device includes a transmission circuit unit configured to transmit data to the transmission channel. When an overcurrent caused by a simultaneous transmission of data to the transmission channel is detected during data transmission, the transmission circuit unit increases an output resistance, which is a resistance value for an output to the transmission channel, to an resistance value corresponding to a characteristic of a facility equipment item that transmits data to the transmission channel at the same time as itself.

8 Claims, 11 Drawing Sheets

(51) Int. Cl.
  *F24F 1/0007*   (2019.01)
  *F24F 1/06*     (2011.01)
  *F24F 3/00*     (2006.01)
  *F24F 11/88*    (2018.01)
  *H03K 17/28*    (2006.01)
  *H02H 3/093*    (2006.01)
  *H04L 12/413*   (2006.01)

(52) U.S. Cl.
  CPC ............ *F24F 11/88* (2018.01); *H02H 3/093* (2013.01); *H03K 17/28* (2013.01); *H04L 12/413* (2013.01)

(56) References Cited

U.S. PATENT DOCUMENTS

2013/0294319 A1* 11/2013 Haapaniemi ........ H04W 72/121
  370/312
2016/0037484 A1*  2/2016 Kwon ................. H04W 74/004
  370/312

* cited by examiner

TRANSMISSION DEVICE, AIR-CONDITIONING APPARATUS, AND AIR-CONDITIONING SYSTEM

CROSS REFERENCE TO RELATED APPLICATION

This application is a U.S. national stage application of International Application No. PCT/JP2018/026198, filed on Jul. 11, 2018, the contents of which are incorporated herein by reference.

TECHNICAL FIELD

The present disclosure relates to a transmission device, an air-conditioning apparatus, and an air-conditioning system that adopt a contention method in an arbitration control at a time of data collision.

BACKGROUND

Hitherto, in communication between transmission devices provided in facility equipment items, an arbitration control by a Carrier Sense Multiple Access with Collision Detection (CSMA/CD) method is adopted (for example, see Patent Literature 1). In a case of the CSMA/CD method, each transmission device monitors a communication condition on a transmission channel, and when there is no other transmission device performing data transmission for a certain period of time, the transmission device starts data transmission. When more than one transmission device starts data transmission at the same time, contention processing based on priority codes is performed.

In the meantime, there is a case where some transmission devices having wrong polarity settings are present for some reason and a plurality of transmission devices start data transmissions at the same time. In such a case, opposite polarity pulses come into collision and thus short-circuit occurs. Consequently, each of the transmission devices executes an overcurrent limit control by using a transmission limit circuit formed of an integrated circuit (IC), for example.

Patent Literature 1 describes a case where transmission devices that transmit data at the same time have transmission limit circuits having the same overcurrent limit characteristic (see FIG. 6), and in such a case, pulses on a transmission channel will be cancelled out. For this reason, each transmission device can detect a polarity setting error by monitoring whether or not a pulse that the transmission device itself transmits is present on the transmission channel.

PATENT LITERATURE

Patent Literature 1: Japanese Unexamined Patent Application Publication No. H04-160842

However, when the transmission devices that transmit data at the same time have transmission limit circuits having different overcurrent limit characteristics, the pulses on the transmission channel may not be cancelled out, and thus each transmission device cannot detect the polarity setting error. Here, for example, when a new transmission limit circuit that is compatible with an existing transmission limit circuit is developed, the above problem can be avoided if a new transmission limit circuit that has exactly the same overcurrent limit characteristic as that of the existing transmission limit circuit can be designed.

Even so, when a new transmission limit circuit is designed, it is difficult to obtain the same overcurrent limit characteristic as that of the existing transmission limit circuit. The reason is that, since an overcurrent limit characteristic varies depending on characteristics of an output resistor, those of a switching element and other factors in a transmission limit circuit, and thus when a new transmission limit circuit is designed by using a different component or IC, it is difficult to obtain completely the same characteristics as those of the existing one. Even in a case between new transmission limit circuits, it is difficult to obtain the same overcurrent limit characteristic in them.

SUMMARY

The present disclosure has been made to overcome the abovementioned problem, and an object thereof is to provide a transmission device, an air-conditioning apparatus, and an air-conditioning system that are capable of accurately detecting a polarity setting error even when data having a wrong polarity setting and data having a correct polarity setting collide with each other on a transmission channel.

A transmission device according to one embodiment of the present disclosure is a transmission device for transmitting and receiving data through a transmission channel. The transmission device includes a transmission circuit unit configured to transmit data to the transmission channel. When an overcurrent caused by a simultaneous transmission of data to the transmission channel is detected during data transmission, the transmission circuit unit increases an output resistance, which is a resistance value for an output to the transmission channel, to a resistance value corresponding to a characteristic of a facility equipment item that transmits data to the transmission channel at a same time as itself.

An air-conditioning apparatus according to another embodiment of the present disclosure includes a heat exchanger, a fan configured to send air to the heat exchanger, and the transmission device described above. An air-conditioning system according to still another embodiment of the present disclosure includes a plurality of the air-conditioning apparatuses described above, and at least one of the air-conditioning apparatuses is an indoor unit configured to perform air-conditioning in an air-conditioned space, and at least one of the air-conditioning apparatuses is an outdoor unit installed outdoors.

According to one embodiment of the present disclosure, when an overcurrent is detected during data transmission, an output resistance, which is a resistance value for an output to a transmission channel, is increased, and thereby lowering a peak value of the voltage on a transmission channel. As a result, even when data having a wrong polarity setting and data having a correct polarity setting collide with each other on the transmission channel, a polarity setting error can be accurately detected.

DETAILED DESCRIPTION

Embodiment 1

Figure 1:
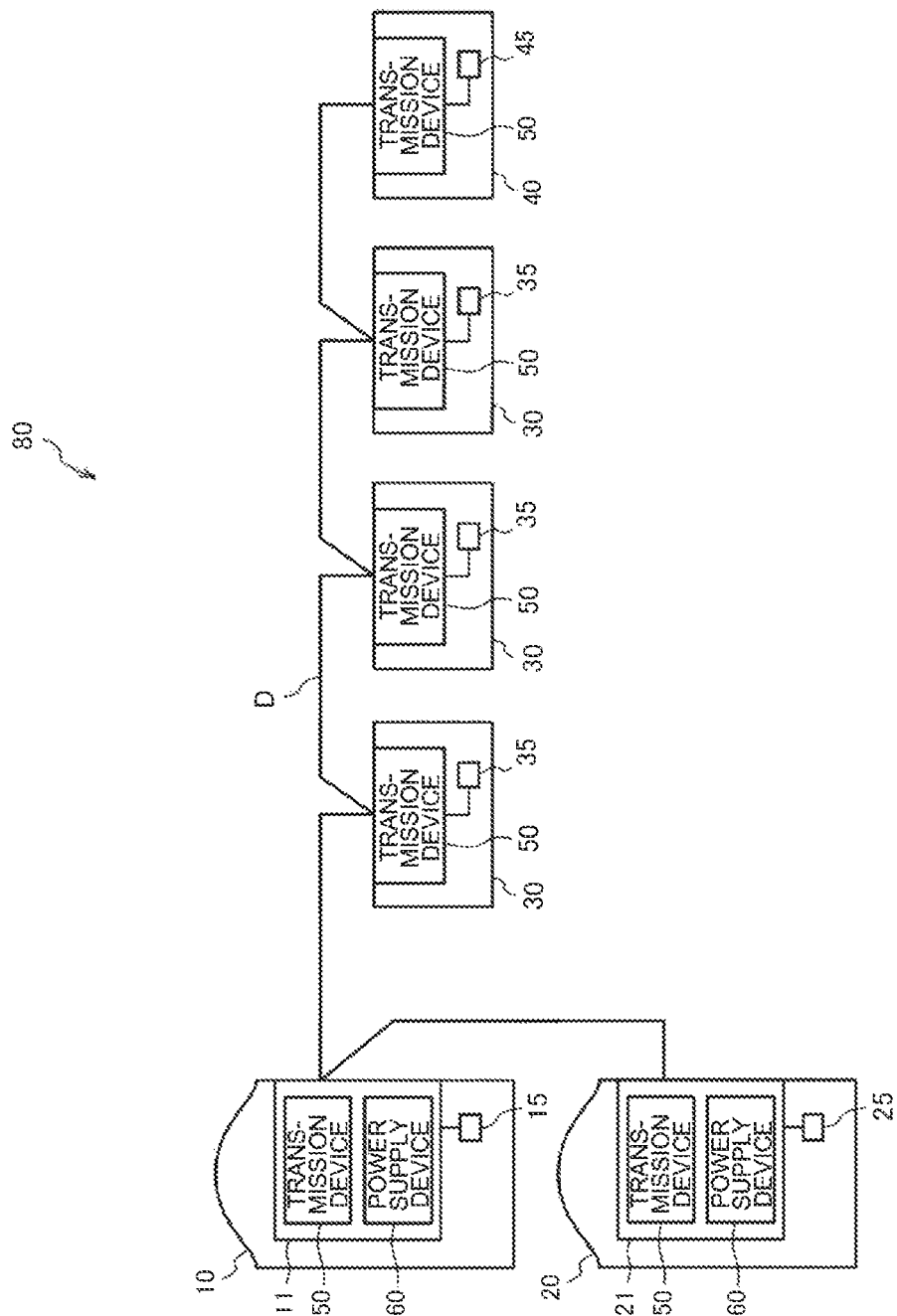
FIG. 1 is a block diagram illustrating an entire configuration of a facility system according to Embodiment 1 of the present disclosure.

FIG. 1 is a block diagram illustrating an entire configuration of a facility system according to Embodiment 1 of the present disclosure. In Embodiment 1, an air-conditioning system is illustrated as a facility system 80. In the example of FIG. 1, the facility system 80 includes, as a plurality of facility equipment items, a main outdoor unit 10, a sub-outdoor unit 20, three indoor units 30, and a controller device 40. The main outdoor unit 10 and the sub-outdoor unit 20 are air-conditioning units that are installed outdoors, and the indoor units 30 are air-conditioning units configured to perform air-conditioning in an air-conditioned space.

In the facility system 80, each of the indoor units 30 and the controller device 40 are connected to the main outdoor unit 10 and the sub-outdoor unit 20 via a transmission channel D formed of two transmission lines. Normally, the main outdoor unit 10 applies a direct-current (DC) voltage to the transmission channel D to supply power to at least some of the indoor units 30 and the controller device 40. Meanwhile, when the main outdoor unit 10 cannot supply power due to a trouble or other reason, the sub-outdoor unit 20 supplies power to at least some of the indoor units 30 and the controller device 40.

As shown in FIG. 1, each of the main outdoor unit 10, the sub-outdoor unit 20, the indoor units 30, and the controller 40 includes a transmission device 50 that is configured to transmit and receive data through the transmission channel D. That is, facility equipment items are configured to exchange information on air-conditioning control through the transmission devices 50. The facility system 80 adopts Alternate Mark Inversion (AMI) communication system in communication among facility equipment items, and performs half-duplex communication based on the polarity of the DC voltage applied to the transmission channel D. That is, facility equipment items use the AMI communication to perform communication based on a communication protocol of collision contention.

It is assumed that the facility system 80 of Embodiment 1 is an air-conditioning system formed of a plurality of facility equipment items using existing transmission limit circuits 1000, and that new facility equipment items in which transmission limit circuits 100 of Embodiment 1 are embedded are added to the air-conditioning system. That is, a plurality of transmission devices 50 in the facility system 80 include both transmission devices 50 provided with the transmission limit circuits 1000 and transmission devices 50 provided with the transmission limit circuits 100.

Each of the main outdoor unit 10 and the sub-outdoor unit 20 is installed outdoors, for example, and includes a compressor, an outdoor heat exchanger, and an outdoor fan, all of which form part of a refrigeration cycle and are not shown in the drawings. The compressor is driven by an inverter, for example, and compresses and discharges a sucked refrigerant. The outdoor heat exchanger is a fin-and-tube heat exchanger and causes heat exchange to be performed between air and refrigerant. The outdoor fan sends outdoor air to the outdoor heat exchanger.

Each of the main outdoor unit 10 and the sub-outdoor unit 20 also includes a power supply device 60 configured to supply power to the indoor units 30 and the controller device 40. That is, a circuit unit 11 of the main outdoor unit 10 includes the transmission device 50 and the power supply device 60. Similarly, a circuit unit 21 of the sub-outdoor unit 20 includes the transmission device 50 and the power supply device 60.

In the facility system 80 in a normal condition, the power supply device 60 of the main outdoor unit 10 supplies power to the indoor units 30 and the controller device 40. However, when the main outdoor unit 10 cannot perform power supply due to a trouble, the power supply device 60 of the sub-outdoor unit 20 supplies power to the indoor units 30 and the controller device 40.

In addition, the main outdoor unit 10 includes a controller device 15 configured to control each actuator in the main outdoor unit 10. The sub-outdoor unit 20 includes a controller device 25 configured to control each actuator in the sub-outdoor unit 20. The controller device 25 executes power supply switching processing when the main outdoor unit 10 is stopped.

Each of the indoor units 30 is installed indoors and is configured to adjust air environment of an air-conditioned space. Each of the indoor units 30 includes an expansion valve and an indoor heat exchanger, which form part of a refrigeration cycle, and an indoor fan configured to send air to the indoor heat exchanger. The expansion valve is formed of an electronic expansion valve, for example, and is configured to decompress and expand refrigerant. The indoor heat exchanger is formed of a fin-and-tube heat exchanger, for example, and is configured to cause heat exchange to be performed between air and refrigerant. Each of the indoor units 30 also includes a controller 35 configured to control each actuator in the indoor unit 30.

The controller device 40 is a remote controller device for operating and managing the indoor units 30 or a centralized controller device for comprehensively managing the facility system 80. The controller device 40 includes a controller device 45 configured to control all processes performed by the controller device 40. For example, the controller device 45 transmits an operation signal indicating contents of an input operation to the indoor unit 30 or other unit via the transmission device 50 and the transmission channel D.

Each of the controller device 15, the controller device 25, the controller device 35, and the controller device 45 outputs a transmission instruction, which is a signal that instructs data transmission, to the transmission device 50. Via the transmission device 50, each of the controller device 15, the controller device 25, the controller device 35, and the controller device 45 receives data from other facility equipment items or transfers data received from other facility equipment items. The controller device 15, the controller device 25, the controller device 35, and the controller device 45 perform data communication with each other to control the facility system 80 together.

Figure 2:
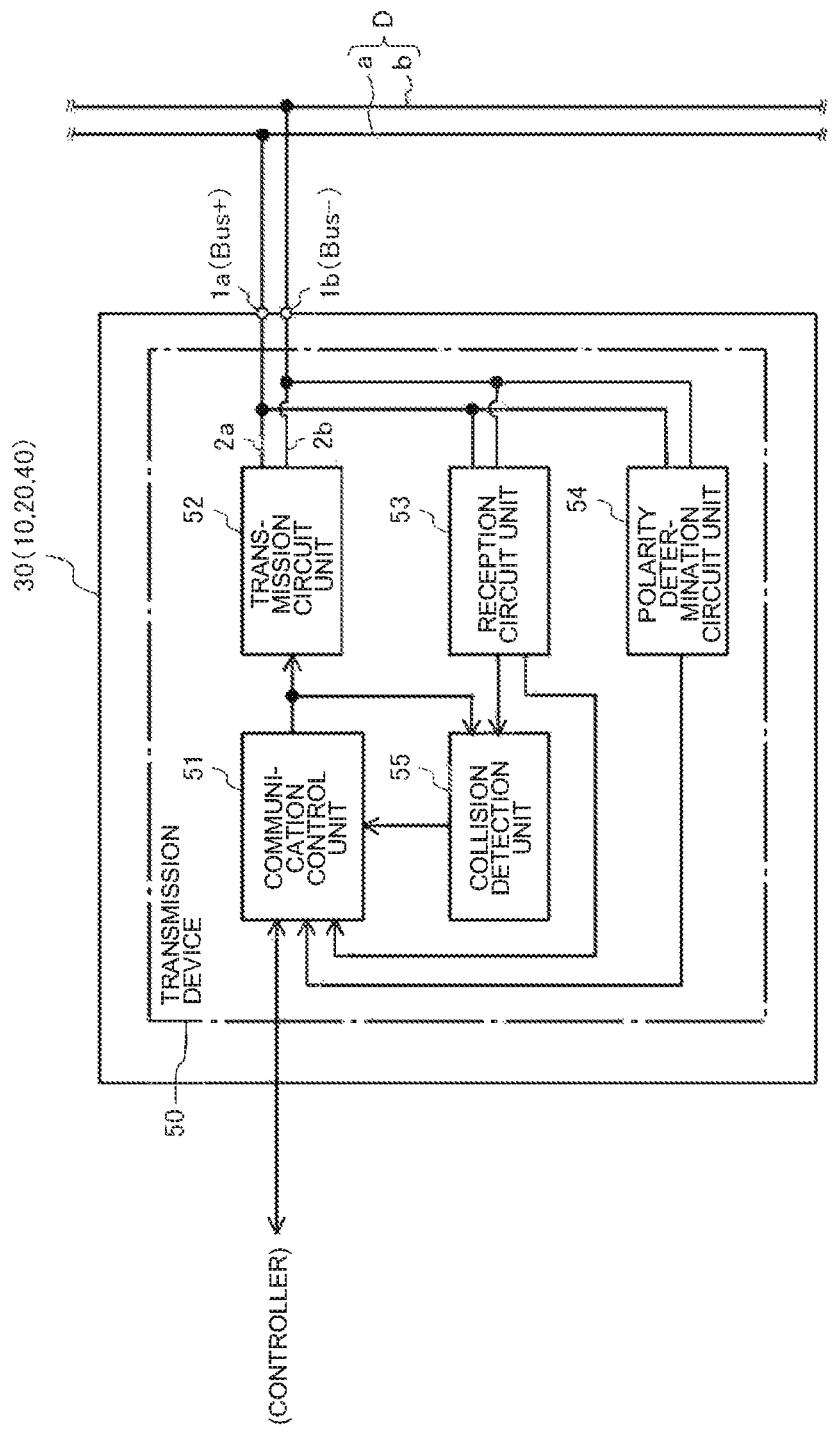
FIG. 2 is a configuration diagram schematically illustrating a circuit configuration of a transmission device of FIG. 1.
Figure 3:
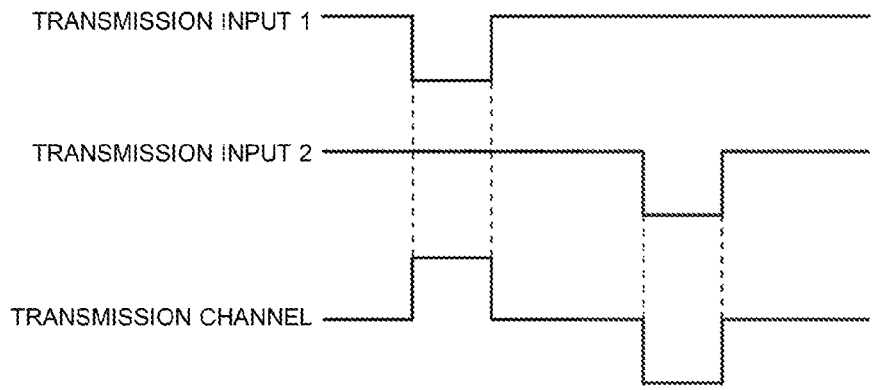
FIG. 3 is an explanatory view illustrating a state in which superimposed pulses are transmitted to a transmission channel by a transmission device of FIG. 1.

FIG. 2 is a configuration diagram schematically illustrating a circuit configuration of a transmission device of FIG. 1. FIG. 3 is an explanatory view for illustrating a state in which superimposed pulses are transmitted to a transmission channel by a transmission device of FIG. 1. Note that a schematic configuration of the transmission device 50 is common to both the transmission device 50 provided with the existing transmission limit circuit and the transmission device 50 provided with the transmission limit circuit of Embodiment 1. In addition, because a connection relationship between the transmission device 50 and the transmission channel D is the same among the facility equipment items, the configuration of the indoor unit 30 is shown in FIG. 2 as a typical example.

As shown in FIG. 2, the indoor unit 30, that is each facility equipment item, has a Bus positive terminal 1a and a Bus negative terminal 1b. The transmission channel D is formed of a transmission line a and a transmission line b. The transmission line a is connected to the Bus positive terminal 1a or the Bus negative terminal 1b, and the transmission line b is connected to the one to which the transmission line a is not connected. The combinations of connections between the transmission line a or the transmission line b and the Bus positive terminal 1a or the Bus negative terminal 1b are not necessarily unified among the facility equipment items. That is, in the facility system 80, each facility equipment item is configured to determine the polarity of a transmission pulse based on the polarity of DC power supply of the transmission channel D. Note that, FIG. 2 shows an example in which the transmission line a is connected to the Bus positive terminal 1a, and the transmission line b is connected to the Bus negative terminal 1b.

The transmission device 50 includes a communication control unit 51, a transmission circuit unit 52, a reception circuit unit 53, a polarity determination circuit unit 54, and a collision detection unit 55. An electric line 2a and an electric line 2b extend from the transmission circuit unit 52, and the electric line 2a is connected to the Bus positive terminal 1a and the electric line 2b is connected to the Bus negative terminal 1b.

When the transmission circuit unit 52 transmits data and detects an overcurrent caused by a simultaneous transmission of data to the transmission channel D by another facility equipment item, the transmission circuit unit 52 is configured to increase an output resistance, which is a resistance value for an output to the transmission channel D, to a resistance value in accordance with a characteristic of the facility equipment item that has transmitted data to the transmission channel D at the same time. The characteristic of the facility equipment item corresponds to an overcurrent limit characteristic of a transmission limit circuit included in the transmission device 50 of the facility equipment item.

The transmission circuit unit 52 is controlled by the communication control unit 51 and superimposes and transmits pulses to the transmission channel D. As shown in FIG. 3, two kinds of signals, which are a transmission input 1 and a transmission input 2, are alternately input to the transmission circuit unit 52 from the communication control unit 51. The transmission circuit unit 52 is configured to transmit a positive pulse to the transmission channel D when the transmission input 1 is input from the communication control unit 51, and transmit a negative pulse to the transmission channel D when the transmission input 2 is input from the communication control unit 51.

The reception circuit unit 53 is configured to determine whether a pulse on the transmission channel D is "0" (present) or "1" (absent), and transmit a signal indicating the determination result to the collision detection unit 55 and the communication control unit 51. The reception circuit unit 53 does not have a function to determine the polarity of pulse. The polarity determination circuit unit 54 outputs polarity information indicating the polarity of the DC voltage applied to the transmission channel D to the communication control unit 51.

The collision detection unit 55 is configured to compare a transmission input signal that is an input signal to the transmission circuit unit 52 from the communication control unit 51 with a reception output signal that is an output signal from the reception circuit to detect an occurrence of pulse collision. The communication control unit 51 determines the polarity of pulse based on the polarity information output from the polarity determination circuit unit 54. In addition, the communication control unit 51 transfers data, which has been input from the reception circuit unit 53, to the controller device 15, the controller device 25, the controller device 35, and the controller device 45.

Figure 4:
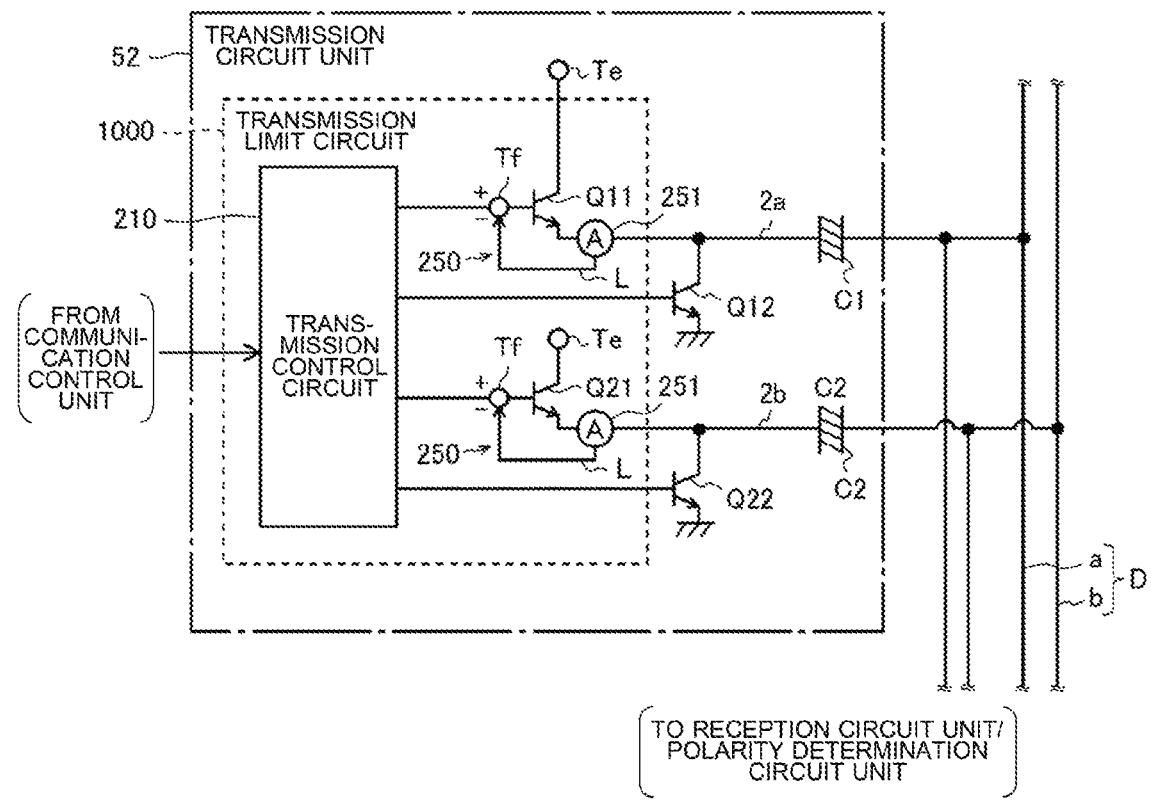
FIG. 4 is a configuration diagram illustrating a circuit configuration of a transmission circuit unit provided with an existing transmission limit circuit.
Figure 5:
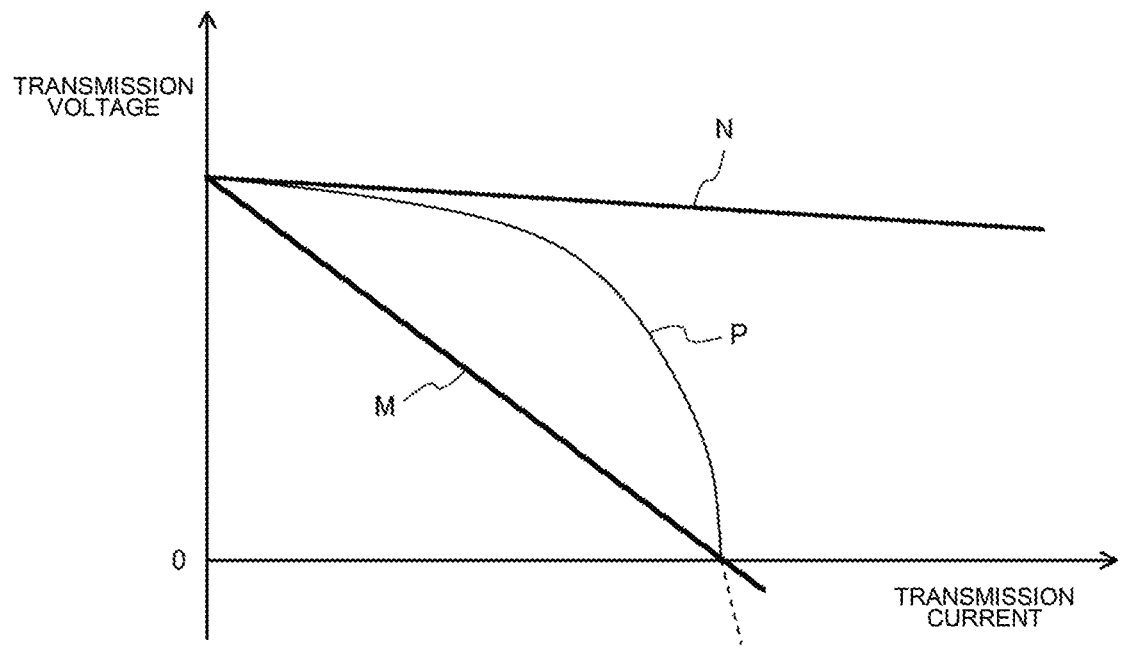
FIG. 5 is a graph illustrating, as an example, an overcurrent limit characteristic of an existing transmission limit circuit and that of a transmission limit circuit according to Embodiment 1 of the present disclosure.

FIG. 4 is a configuration diagram illustrating a circuit configuration of a transmission circuit unit provided with an existing transmission limit circuit. FIG. 5 is a graph illustrating, as an example, an overcurrent limit characteristic of an existing transmission limit circuit and that of a transmission limit circuit according to Embodiment 1 of the present disclosure. In FIG. 5, the vertical axis represents transmission voltage while the horizontal axis represents transmission current. Line P represents a voltage-current characteristic, that is, an overcurrent limit characteristic, of the existing transmission limit circuit 1000. Line N represents an overcurrent limit characteristic in a normal transmission mode of the transmission limit circuit 100 of Embodiment 1. Line M represents an overcurrent limit characteristic in an overcurrent limit mode of the transmission limit circuit 100 of Embodiment 1. These overcurrent limit characteristics depend on characteristics of a switching element Q11 and a switching element Q21 used in the circuit, characteristics of feedback gain, and other factors.

The transmission circuit unit 52 of FIG. 4 includes the transmission limit circuit 1000, a switching element Q12, a switching element Q22, a capacitor C1 and a capacitor C2. The transmission limit circuit 1000 is formed of, for example, an integrated circuit (IC), and is an existing integrated circuit used for communication. The transmission limit circuit 1000 includes a transmission control circuit 210, the switching element Q11, the switching element Q21, and two overcurrent limit circuits 250 installed corresponding to the switching element Q11 and the switching element Q21.

Each overcurrent limit circuit 250 includes an overcurrent detection unit 251, a feedback terminal Tf, and a feedback line L. The overcurrent detection unit 251 and the feedback terminal Tf are connected by the feedback line L, and a current flowing into the overcurrent detection unit 251 is fed back to a feedback terminal Tf side.

Collectors of the switching element Q11 and the switching element Q21 are connected to transmission power sources via power source terminals Te. The overcurrent limit circuits 250 attached to the switching element Q11 and the switching element Q21 have the overcurrent characteristic represented by Line P in FIG. 5.

Emitters of the switching element Q11 and the switching element Q21 are connected to the overcurrent detection units 251, and bases thereof are connected to feedback terminals Tf. A collector of the switching element Q12 is connected to the electric line 2*a*, an emitter thereof is connected to the ground, and a base thereof is connected to the transmission control circuit 210. A collector of the switching element Q22 is connected to the electric line 2*b*, an emitter thereof is connected to the ground, and a base thereof is connected to the transmission control circuit 210.

The capacitor C1 is provided on the electric line 2*a* between the transmission limit circuit 1000 and the transmission line a, and the capacitor C2 is provided on the electric line 2*b* between the transmission limit circuit 1000 and the transmission line b. The capacitors C1 and C2 are configured to cut off DC components in the transmission channel D.

In Embodiment 1, as the switching elements Q11, Q21, Q12 and Q22, transistors are used. As a matter of course, as these switching elements, Metal-Oxide-Semiconductor Field-Effect Transistors (MOSFETs) may be used.

The transmission circuit unit 52 transmits a pulse to the transmission channel D by simultaneously turning on a combination of the switching element Q11 and the switching element Q22 or a combination of the switching element Q12 and the switching element Q21. That is, when the transmission input 1 is input from the communication control unit 51, the transmission control circuit 210 turns on the switching element Q11 and the switching element Q22. When the transmission input 2 is input from the communication control unit 51, the transmission control circuit 210 turns on the switching element Q12 and the switching element Q21.

Figure 6:
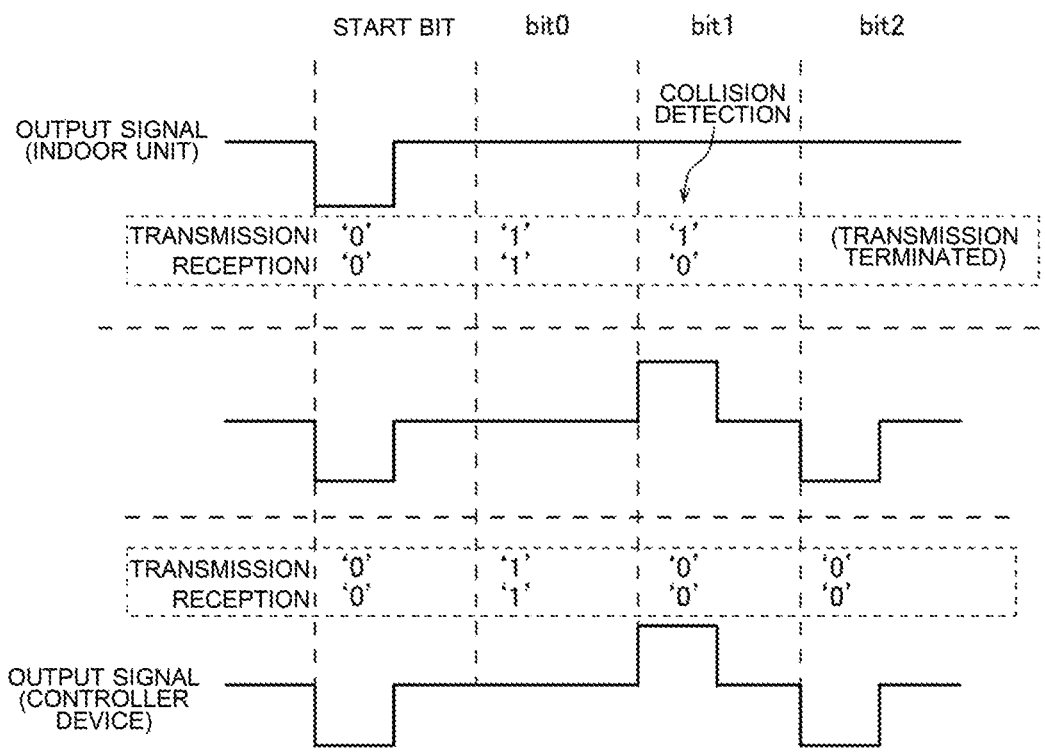
FIG. 6 is an explanatory view illustrating a waveform on a transmission channel and a contention mechanism at time of pulse collision in the air-conditioning system of FIG. 1.

FIG. 6 is an explanatory view illustrating a waveform on a transmission channel and a contention mechanism at time of pulse collision in the air-conditioning system of FIG. 1.

FIG. 6 shows a case where one of the indoor units 30 and the controller device 40 output pulses having priority codes. For each bit in FIG. 6, logic '0' corresponds to the presence of pulse and logic '1' corresponds to the absence of pulse.

The polarity of a start bit is determined based on the polarity of DC application voltage, and for the subsequent bits, pulses are transmitted by alternately switching the polarity. When each facility equipment item is going to start data transmission, the facility equipment item monitors signals on the transmission channel D for a certain period of time and, if no signal is present on the transmission channel D for that period, the facility equipment item starts data transmission. When more than one facility equipment item starts data transmission at the same time, contention processing based on the logic is performed for each bit. The processing is specified so that logic '0' wins against logic '1'.

As shown in FIG. 6, each facility equipment item that performs data transmission receives a signal indicating the transmission status on the transmission channel D while transmitting pulses. In a case where one facility equipment item receives a logic '0' when transmitting a logic '1', that is at the bit in which the pulse is transmitted, the facility equipment item is considered to lose a collision and the data transmission is terminated. In this way, a contention processing by CSMA/CD method is achieved. In a normal time, all the facility equipment items load a correct polarity of DC power supply of the transmission channel D, and start transmission of a pulse with the same polarity even when a pulse collision occurs. As a result, the contention processing as shown in FIG. 6 can be performed.

However, there is a case where some of the facility equipment items start data transmission with a wrong polarity for some reasons. One example of the reasons is that, after one of the indoor units 30 is once activated by power supply from the main outdoor unit 10 and setting of the polarity has been completed, and when the main outdoor unit 10 stops and the power supply is switched over to the sub-outdoor unit 20, the polarity setting of the indoor unit 30 is kept as it is and is not updated.

Figure 7:
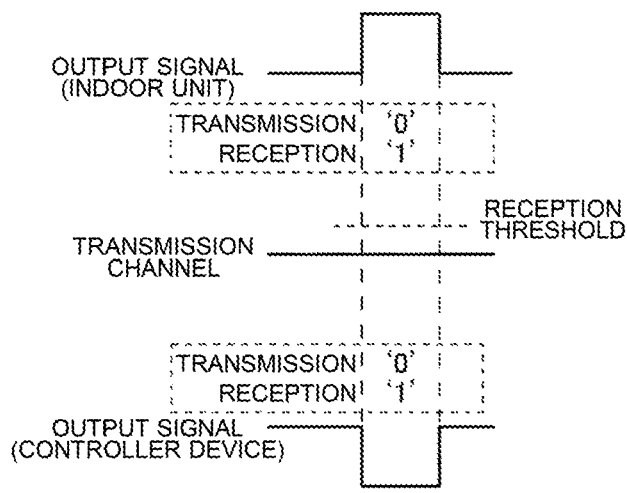
FIG. 7 is an explanatory view illustrating waveforms for a case of collision of pulses that are transmitted with opposite polarities from two facility equipment items having the same overcurrent limit characteristic.
Figure 8:
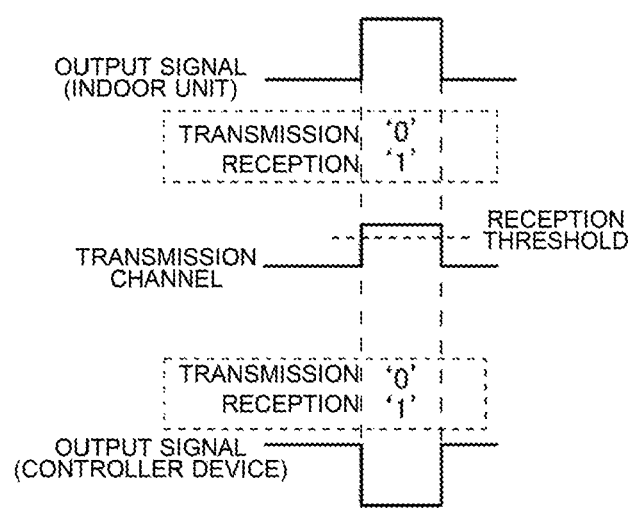
FIG. 8 is an explanatory view illustrating waveforms for a case of collision of pulses that are transmitted with opposite polarities from two facility equipment items having different overcurrent limit characteristics.

FIG. 7 is an explanatory view illustrating waveforms for a case of collision of pulses that are transmitted with opposite polarities from two facility equipment items having the same overcurrent limit characteristic. FIG. 8 is an explanatory view illustrating waveforms for a case of collision of pulses that are transmitted with opposite polarities from two facility equipment items having different overcurrent limit characteristics. As with FIG. 6, FIGS. 7 and 8 show a case where one of the indoor units 30 and the controller device 40 output pulses having priority codes. In FIGS. 7 and 8, it is assumed that the indoor unit 30 has correct polarity information and the controller device 40 has wrong polarity information. In the collision detection unit 55, a reception threshold for detecting a pulse collision is set in advance.

When a pulse collision occurs between a facility equipment item having correct polarity information and a facility equipment item having wrong polarity information, a short-circuit current is generated and overcurrent limitation is applied to both transmission circuit units 52. When both overcurrent limit characteristics are the same, an alternate current (AC) component of transmission channel voltage becomes zero. As a result, because the voltage of the transmission channel D does not exceed the reception threshold as shown in FIG. 7, both transmission devices 50 receive logic '1' even though the transmission devices 50 transmit logic '0'. Thus, because each of the transmission devices 50 can detect an error of polarity setting, that is an abnormal condition, the error of polarity setting can be corrected by performing transmission termination processing and reloading the polarity.

Meanwhile, when both overcurrent limit characteristics are different from each other, the voltage of the transmission channel D does not become equal to or less than the reception threshold as shown in FIG. 8, and thus both transmission devices 50 cannot detect abnormality of the polarity settings. This problem will not occur when a new transmission limit circuit is so designed that the overcurrent limit characteristic thereof is made coincident with that of the existing transmission limit circuit. However, in reality, it is difficult to make the overcurrent limit characteristics coincide entirely with those of the existing circuit, and it is more difficult especially when a new transmission limit circuit is designed by using a Complementary Metal Oxide Semiconductor (CMOS). To overcome the problem, the transmission limit circuit 100 of Embodiment 1 is configured to increase an output resistance, which is a resistance value for an output to the transmission channel D, when an overcurrent is detected.

Figure 9:
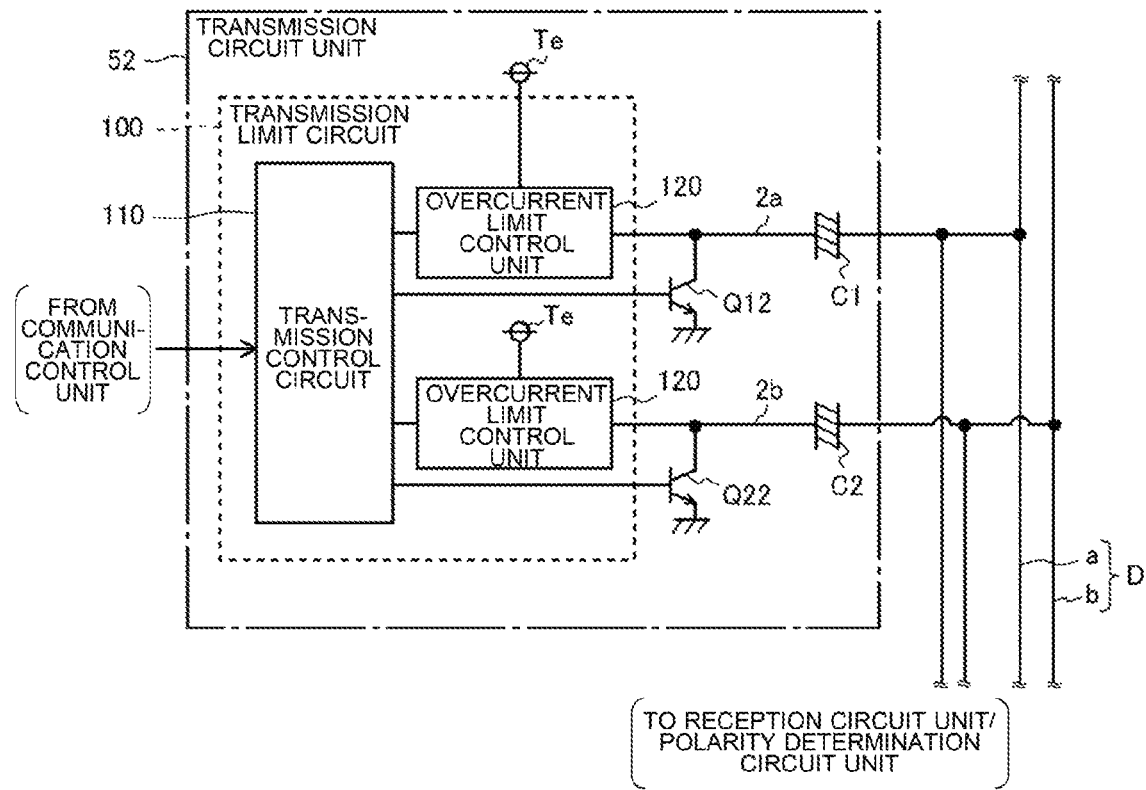
FIG. 9 is a schematic configuration diagram illustrating a configuration of a transmission circuit unit provided with a transmission limit circuit according to Embodiment 1 of the present disclosure.
Figure 10:
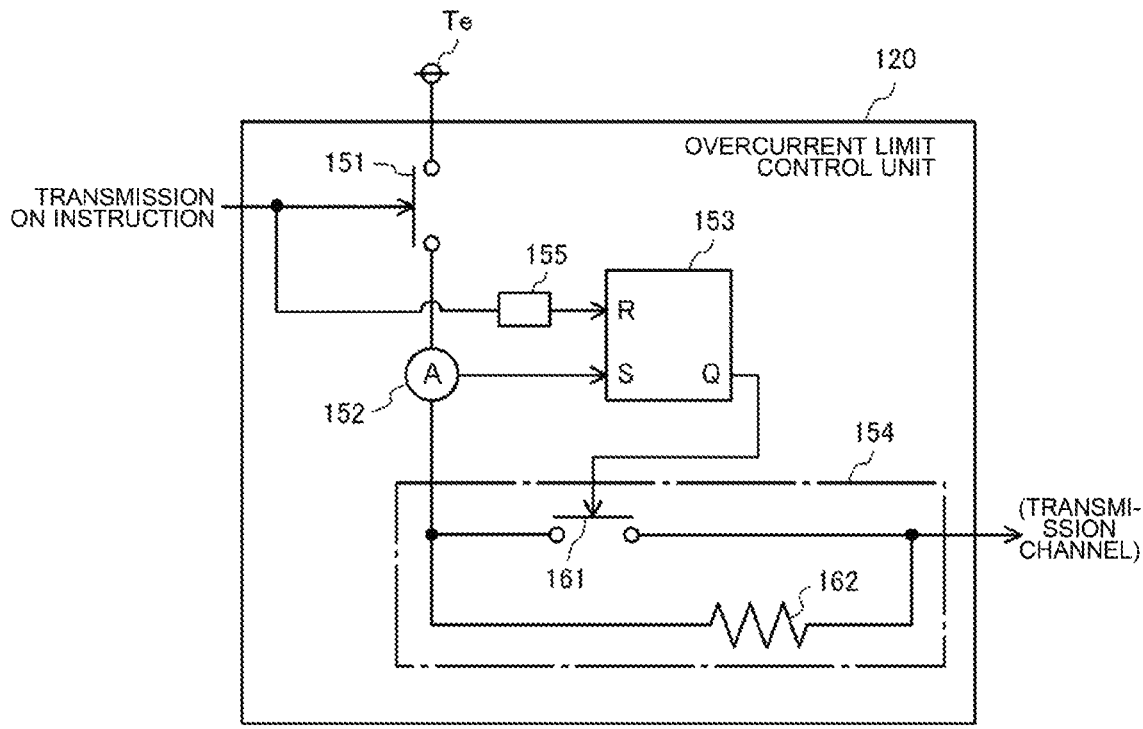
FIG. 10 is a configuration diagram schematically illustrating a circuit configuration of the transmission limit circuit of FIG. 9.
Figure 11:
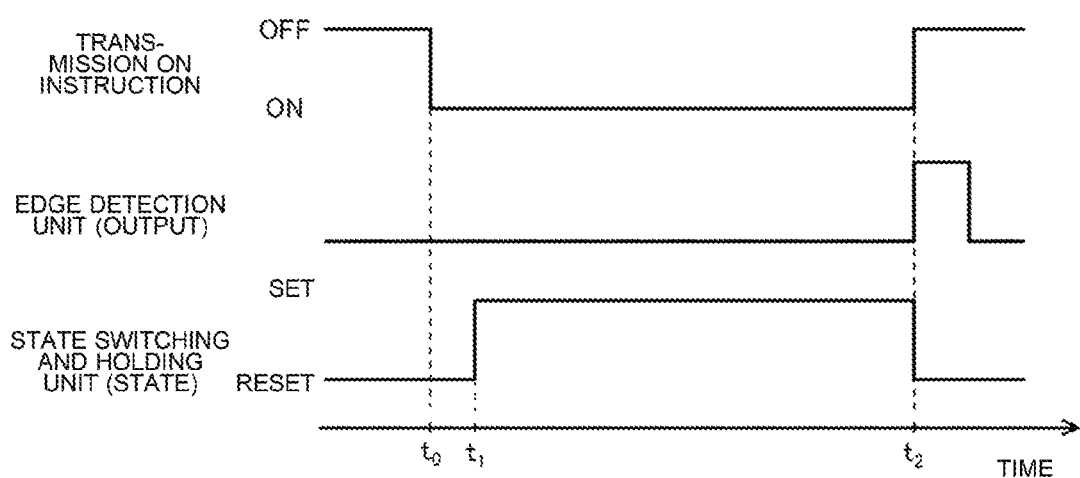
FIG. 11 is a timing diagram illustrating change in a state of a state switching and holding unit in response to an output of an edge detection unit of FIG. 10.
Figure 12:
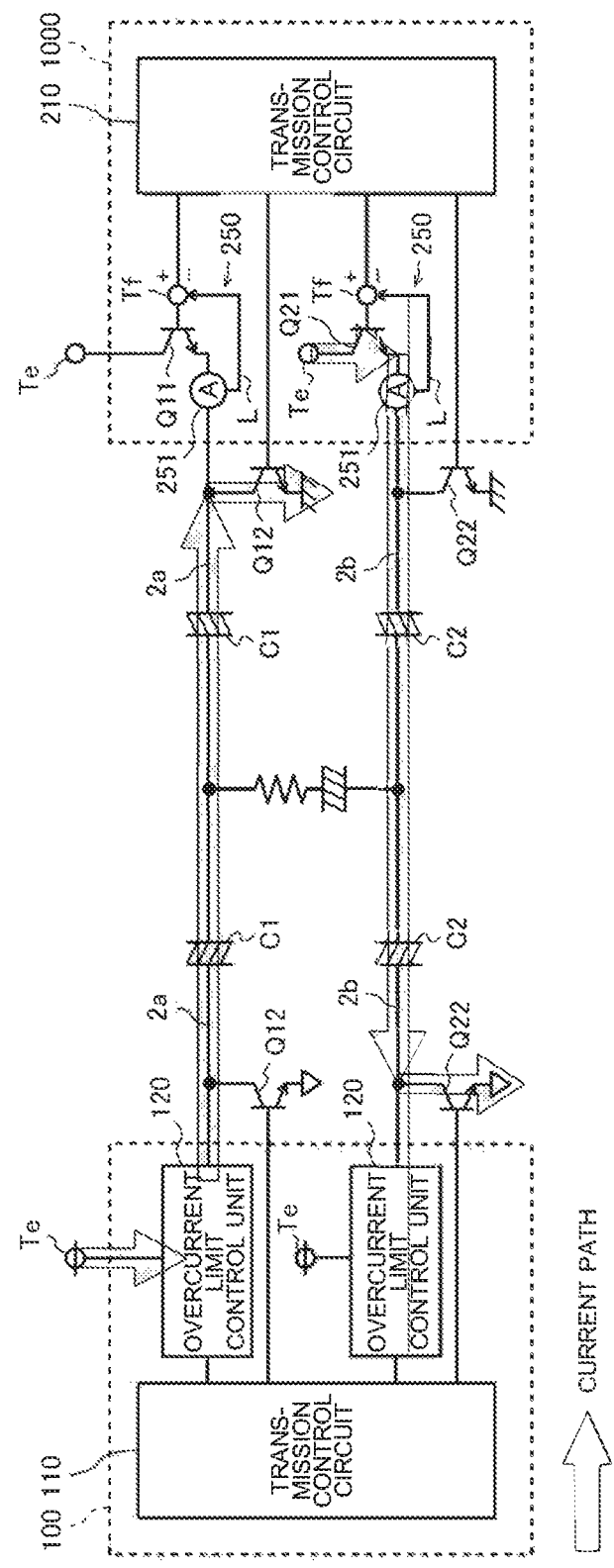
FIG. 12 is an explanatory view schematically illustrating current flows in a case where an output pulse of the transmission limit circuit of FIG. 9 and an output pulse of the transmission limit circuit of FIG. 4 collide with each other in opposite polarities.

FIG. 9 is a schematic configuration diagram illustrating a configuration of a transmission circuit unit provided with a transmission limit circuit according to Embodiment 1 of the present disclosure. FIG. 10 is a configuration diagram schematically illustrating a circuit configuration of the transmission limit circuit of FIG. 9. FIG. 11 is a timing diagram illustrating change in a state of a state switching and holding unit in response to an output of an edge detection unit of FIG. 10. FIG. 12 is an explanatory view schematically illustrating current flows in a case where an output pulse of the transmission limit circuit of FIG. 9 and an output pulse of the transmission limit circuit of FIG. 4 collide with each other in opposite polarities. With reference to FIGS. 9 to 12, a specific configuration of the transmission limit circuit of Embodiment 1 will be described. Components which are the same as or similar to those in FIG. 4 will be denoted by the same reference signs, and their descriptions will be omitted.

As shown in FIG. 9, the transmission limit circuit 100 of Embodiment 1 includes a transmission control circuit 110 and two overcurrent limit control units 120. In other words, a combination of the switching element Q11 and the overcurrent limit circuit 250 and a combination of the switching element Q21 and the overcurrent limit circuit 250 of the existing transmission limit circuit 1000 shown in FIG. 4 are replaced by the overcurrent limit control units 120 in the transmission limit circuit 100.

The transmission control circuit 110 is configured to control data transmission by making a current-carrying unit 151, which will be described later, turn on and off. When the transmission control circuit 110 receives the transmission input 1 from the communication control unit 51, the transmission control circuit 110 outputs an transmission ON instruction to one of the overcurrent limit control units 120 (the upper one in the drawing) while turning on the switching element Q22. In addition, when the transmission control circuit 110 receives the transmission input 2 from the communication control unit 51, the transmission control circuit 110 outputs an transmission ON instruction to the other overcurrent limit control unit 120 (the lower one in the drawing) while turning on the switching element Q12. The transmission ON instruction includes a signal for turning on the current-carrying unit 151 and a signal output to a state switching and holding unit 153.

The overcurrent limit control unit 120 is configured to increase an output resistance when an overcurrent is detected during data transmission. The overcurrent limit control unit 120 includes the current-carrying unit 151, an overcurrent detection unit 152, the state switching and holding unit 153, an output resistance adjustment unit 154, and an edge detection unit 155.

The output resistance adjustment unit 154 is configured to adjust an output resistance when the overcurrent detection unit 152 detects an overcurrent, and is installed between the current-carrying unit 151 and the transmission channel D. The output resistance adjustment unit 154 of Embodiment 1 is formed by connecting a transmission capacity switching unit 161 and a current limit resistor 162 in parallel to each other, and is installed downstream of the overcurrent detection unit 152.

The current-carrying unit 151 (transmission amplifier) includes a switching element formed of a transistor or a MOSFET. The current-carrying unit 151 is connected to a transmission power source, that is a high-voltage side, via the power source terminal Te, and is configured to conduct and block a current. The current-carrying unit 151 is configured to be turned on and off in response to a signal from the transmission control circuit 110.

The overcurrent detection unit 152 is installed between the current-carrying unit 151 and the output resistance adjustment unit 154, and is configured to output a signal indicating '1' or '0' to the state switching and holding unit 153. That is, the overcurrent detection unit 152 is configured to determine whether or not an output current exceeds an overcurrent detection threshold Tc. The overcurrent detection threshold Tc is a threshold used as a reference for determining whether or not an overcurrent occurs, and is set in advance in the overcurrent detection unit 152. In addition, when the output current exceeds the overcurrent detection threshold Tc, the overcurrent detection unit 152 is configured to output a signal indicating that the output current exceeds the overcurrent detection threshold Tc, that is a signal indicating detection of the overcurrent to the state switching and holding unit 153.

The edge detection unit 155 is a circuit configured to detect a transmission end edge (a rear edge of a transmission signal) that indicates the end of a transmission ON instruction. The edge detection unit 155 outputs a signal indicating '1' or '0' to the state switching and holding unit 153 in response to an transmission ON instruction from the transmission control circuit 110. When detecting the transmission end edge, the edge detection unit 155 outputs a signal indicating '1' to an R terminal (reset terminal) of the state switching and holding unit 153.

When the overcurrent detection unit 152 detects an overcurrent, the state switching and holding unit 153 outputs a signal that turns transmission capacity switching unit 161 off. The state switching and holding unit 153 is formed of an RS flip-flop, for example, and a signal indicating '1' or '0' is input to the R terminal from the edge detection unit 155 and a signal indicating '1' or '0' is input to an S terminal (set terminal) from the overcurrent detection unit 152. The state switching and holding unit 153 is set when the overcurrent detection unit 152 detects an overcurrent and is reset when the edge detection unit 155 detects a transmission end edge. That is, the state switching and holding unit 153 enters a set state in response to a signal input from the overcurrent detection unit 152, and outputs a signal that turns off the transmission capacity switching unit 161. In addition, the state switching and holding unit 153 enters a reset state when a signal indicating '1' is input to the R terminal from the edge detection unit 155, and outputs a signal that turns on the transmission capacity switching unit 161.

Now, based on FIG. 11, state changes of the state switching and holding unit 153 will be explained. In an example of FIG. 11, a transmission ON instruction is output from the transmission control circuit 110 at time $t_0$, and an overcurrent is detected by the overcurrent detection unit 152 at time $t_1$. Thus, the state switching and holding unit 153 enters a set state at time $t_1$. Then, at time $t_2$, the edge detection unit 155 detects a transmission end edge and outputs a signal indicating '1' to the R terminal of the state switching and holding unit 153. Thus, the state switching and holding unit 153 enters a reset state at time $t_2$.

The transmission capacity switching unit 161 is a switching element formed of a transistor, for example, and the on/off operation thereof is controlled according to the state of the state switching and holding unit 153. That is, the transmission capacity switching unit 161 is configured to be turned on/off in response to a signal from the state switching and holding unit 153.

Here, a state in which the state switching and holding unit 153 is reset is a "normal transmission mode," and, at this time, the transmission capacity switching unit 161 is turned on. A state in which the state switching and holding unit 153 is set is an "overcurrent limit mode," and the transmission capacity switching unit 161 is turned off.

The current limit resistor 162 has a resistance value corresponding to a characteristic of the facility equipment item that transmits data to the transmission channel D at the same time as the transmission circuit unit 52. More specifically, the resistance value of the current limit resistor 162 is so designed that a peak value obtained when the output pulse of the transmission limit circuit 100 and the output pulse of the existing transmission limit circuit 1000 collide with each other in opposite polarities becomes close to zero voltages. With such a design, transmission currents flow through the paths as shown in FIG. 12 when the output pulse of the transmission limit circuit 100 and the output pulse of the existing transmission limit circuit 1000 collide with each other in opposite polarities, and as a result, the output currents of both transmission limit circuits become the same.

That is, the transmission limit circuit 100 of Embodiment 1 is configured to change output resistance in response to the on/off operation of the transmission capacity switching unit 161. In a normal transmission, the transmission capacity switching unit 161 is in an on state, and a current is output via the transmission capacity switching unit 161. That is, the output resistance is in a relatively low state and an overcurrent limit characteristic shown as line N of FIG. 5 is obtained. Meanwhile, when the overcurrent detection unit 152 detects an overcurrent, the transmission capacity switching unit 161 is turned off by action of the state switching and holding unit 153. Therefore, the current is output via the current limit resistor 162, which is connected in parallel to the transmission capacity switching unit 161. That is, the output resistance is in a relatively high state and an overcurrent limit characteristic shown as line M of FIG. 5 is obtained.

When the current limit resistor 162 is so designed that the current value of the transmission limit circuit 100 at a transmission voltage of zero voltages and the current value of the transmission limit circuit 1000 at a transmission voltage of zero voltages coincide with each other, as shown in FIG. 5, both output voltages become zero voltages at a collision of opposite polarity pulses. Consequently, the peak value of the voltage of the transmission channel D can be adjusted to near zero voltages.

Figure 13:
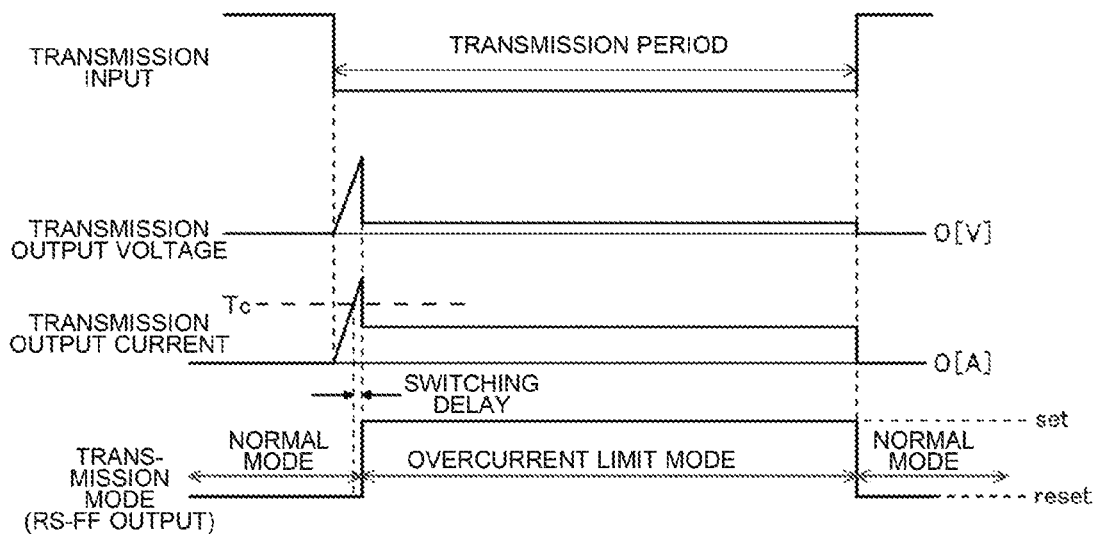
FIG. 13 is a timing diagram for a case where an overcurrent limit control is performed in the transmission limit circuit of FIG. 9.

FIG. 13 is a timing diagram for a case where an overcurrent limit control is performed in the transmission limit circuit of FIG. 9. With reference to FIG. 13, behaviors in a case where an output pulse of the transmission limit circuit 100 and an output pulse of the transmission limit circuit 1000 collide with each other in opposite polarities will be explained.

When pulses collide in opposite polarities, a current larger than that in a normal transmission is generated. When detecting an overcurrent caused by a collision of pulses in opposite polarities, the overcurrent limit control unit 120 switches its transmission mode to the overcurrent limit mode from a normal transmission mode. In addition, due to the pulse collision, overcurrent limitations will be applied to both transmission devices 50 that have output the pulses, and thus it is assumed that output currents will be lowered to the overcurrent detection threshold Tc or below after the detection of the overcurrent. In this respect, in Embodiment 1, since the state switching and holding unit 153 has a state holding function, the overcurrent limit mode will be maintained until termination of a transmission period. As a result, since the peak value of the voltage of the transmission channel D will be kept at neat zero voltages during the transmission period, both transmission devices 50 can determine that the pulses that the transmission devices 50 transmitted are lost and thus can detect the collision of opposite polarities. Note that, as shown in FIG. 13, a switching delay, which is a certain amount of time lag, occurs after the overcurrent detection unit 152 detects that the output current exceeds the overcurrent detection threshold Tc and before the transmission mode is switched to the overcurrent limit mode.

As described above, the transmission device 50 of Embodiment 1 can increase the output resistance when an overcurrent is detected during data transmission, thereby lowering the peak value of the voltage of the transmission channel D. In other words, the transmission limit circuit 100 can changes the transmission current value of own overcurrent limit characteristic at a transmission voltage of zero voltages to match with the transmission current value of the overcurrent limit characteristic of the transmission limit circuit 1000 at a transmission voltage of zero voltages. Therefore, even when data having a wrong polarity setting and data having a correct polarity setting collide with each other on the transmission channel D, an error of the polarity setting can be accurately detected.

Furthermore, in the transmission circuit unit 52, the state switching and holding unit 153 turns off the transmission capacity switching unit 161, which is connected in parallel to the current limit resistor 162, when the output current of the current-carrying unit 151 exceeds the overcurrent detection threshold Tc. As a result, the output resistance is increased, and when a collision of opposite polarity pulses occurs in the facility system 80, which includes facility equipment items having transmission limit circuits 1000 and facility equipment items having the transmission limit circuits 100, the peak value of the pulse on the transmission channel D can be lowered to near zero voltages.

When the transmission limit circuit 100 is designed, the overcurrent detection threshold Tc and the value of the current limit resistor 162 are set corresponding to characteristics of a facility equipment item having the transmission limit circuit 1000. Thus, without making the entire overcurrent characteristics coincide with those of the existing transmission limit circuit, the pulses can be eliminated at an opposite polarity collision. That is, the peak value of the voltage of the transmission channel D will not exceed the reception threshold, and thus the pulse collision can be detected as in the case of the pulse collision between the transmission limit circuits having the same overcurrent limit characteristic (see FIG. 7). As a result, the transmission device 50 can correct the error of the polarity setting by performing transmission stop processing and reloading the polarity.

In the meantime, when a collision of opposite polarity pulses occurs, a current larger than that in a normal transmission flows in the transmission limit circuit 100. When the current larger than that in a normal transmission is detected by the overcurrent detection unit 152, the transmission limit circuit 100 turns off the transmission capacity switching unit 161 to set the output resistance to a high state. In Embodiment 1, a state in which the transmission capacity switching unit 161 is turned off corresponds to a current limit mode. In the transmission limit circuit 100, once an overcurrent is detected, the state switching and holding unit 153, which is formed of an RS flip-flop, keeps a set state, and thus even when the output current is lowered due to the current limit, the current limit mode is not cancelled until termination of the transmission period. Therefore, during the transmission period, the peak value of the voltage of the transmission channel D is maintained at neat zero voltages, and each of the transmission devices 50 that have transmitted data at the same time can determine that the pulse transmitted by itself is lost, and thus can detect an opposite polarity collision.

Furthermore, parameters required in Embodiment 1 are the overcurrent detection threshold Tc and a resistance value of the current limit resistor 162 only, and thus the transmission limit circuit 100 can be easily designed. In addition, the transmission circuit unit 52 includes the transmission control circuit 110, which controls data transmission by making the current-carrying unit 151 turn on and off. That is, because the transmission limit circuit 100 performs an overcurrent limit control by doing only a switching operation, the transmission limit circuit 100 can be easily designed by CMOS process. More specifically, as shown in FIG. 10, the transmission limit circuit 100 of Embodiment 1 can be formed with components that are easily created by CMOS process, such as a switching element, a flip-flop, and a resistor. Therefore, integration of a transmission/reception circuit and a digital circuit, for example, into a single chip is also facilitated.

Embodiment 2

Figure 14:
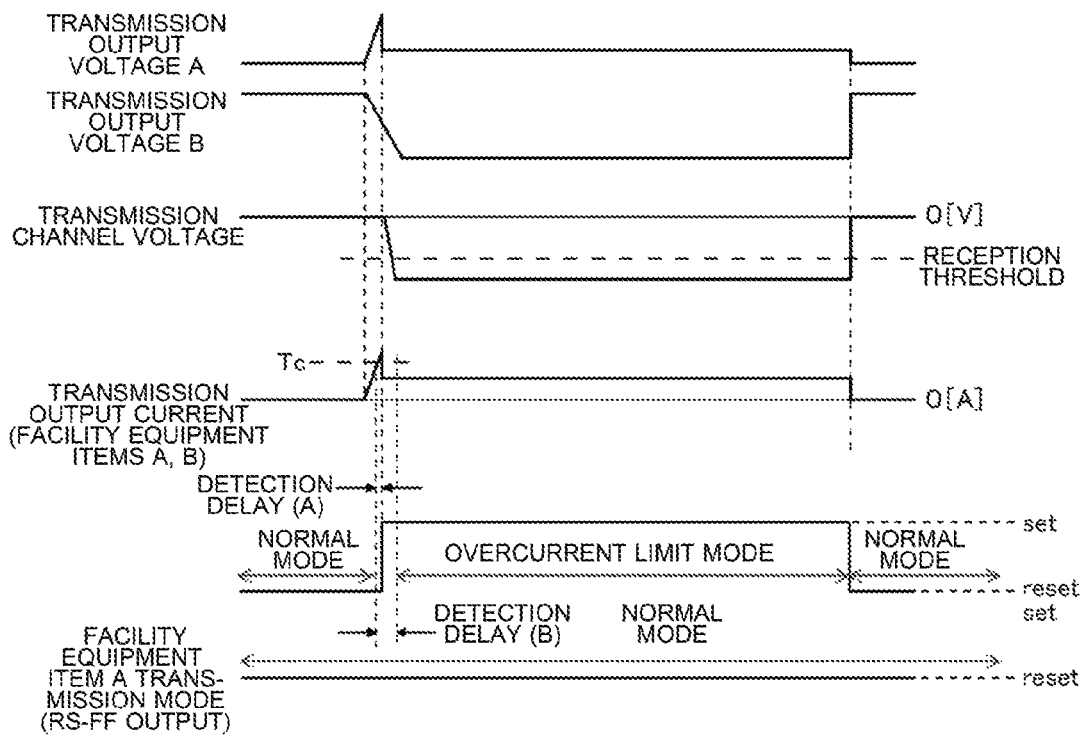
FIG. 14 is a timing diagram illustrating a condition that may occur when an opposite polarity collision occurs between two transmission devices having the transmission limit circuits of Embodiment 1.

FIG. 14 is a timing diagram illustrating a condition that may occur when an opposite polarity collision occurs between two transmission devices having the transmission limit circuits of Embodiment 1. Note that, in FIG. 14, the switching delay from the detection of the overcurrent to the switching of the transmission mode shown in FIG. 13 is omitted.

When an opposite polarity collision occurs between two transmission limit circuits 100 having the overcurrent limit control units 120 shown in FIG. 10, excess currents are generated in both transmission limit circuits 100. However, a detection delay, which is a time period from a start of transmission to detection of an overcurrent, and the overcurrent detection threshold Tc may vary between the transmission limit circuits 100.

Thus, when only one of the transmission limit circuits 100 detects an overcurrent first and enters the current limit mode immediately, the transmission current is decreased and may be dropped below the overcurrent detection threshold Tc before the other transmission limit circuit 100 enters the current limit mode. In such a case, only the one transmission limit circuit 100 keeps the overcurrent limit mode state, and the other transmission limit circuit 100 keeps the normal mode state without entering the overcurrent limit mode. Note that, in FIG. 14, two of the facility equipment items shown in FIG. 1 correspond to a facility equipment item A and a facility equipment item B. The facility equipment item A has the one transmission limit circuit 100 having a detection delay (A), and the facility equipment item B has the other transmission limit circuit 100 having a detection delay (B), and the detection delay (A) is shorter than the detection delay (B).

In this respect, a transmission limit circuit of Embodiment 2 is so designed that, in a system of the transmission channel D where a plurality of transmission devices having new transmission limit circuits are present, even when an opposite polarity collision occurs between two new transmission limit circuits, an error of the polarity setting can be detected.

Figure 15:
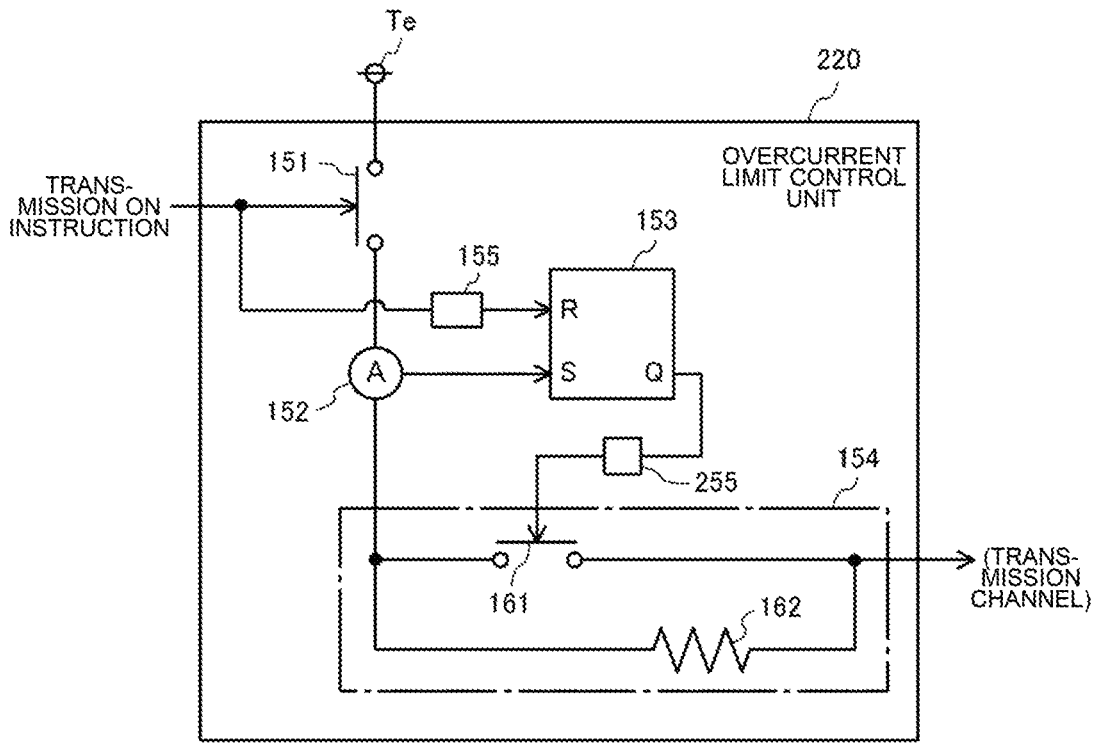
FIG. 15 is a configuration diagram illustrating, as an example, an overcurrent limit control unit of a transmission device according to Embodiment 2 of the present disclosure.

FIG. 15 is a configuration diagram illustrating, as an example, an overcurrent limit control unit of a transmission device according to Embodiment 2 of the present disclosure. In the transmission limit circuit 100 of Embodiment 2, two overcurrent limit control units 120 of FIG. 9 are replaced by overcurrent limit control units 220 of FIG. 15. Other components are the same as those of Embodiment 1, and thus the same components will be denoted by the same reference signs, and the descriptions thereof will be omitted.

In the overcurrent limit control unit 220, a switching time delay unit 255 is provided between the state switching and holding unit 153, which is formed of a RS flip-flop, and the transmission capacity switching unit 161, which is formed of a switching element such as a transistor, and the switching time delay unit 255 is configured to generate a delay of a predetermined time. The switching time delay unit 255 delays the output of a signal from the state switching and holding unit 153 to the transmission capacity switching unit 161 by the set delay time. That is, the switching time delay unit 255 waits until the delay time has elapsed after the state switching and holding unit 153 is switched from the normal transmission mode to the overcurrent limit mode, and then turns the transmission capacity switching unit 161 off.

Figure 16:
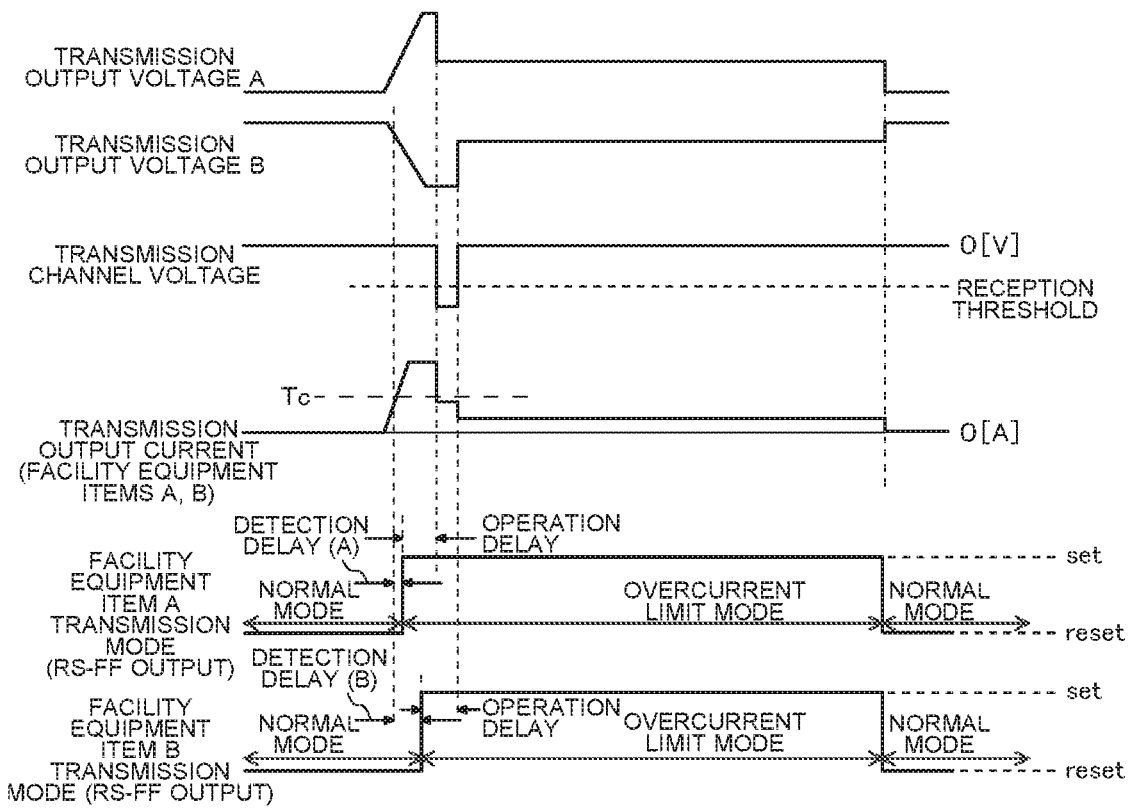
FIG. 16 is a timing diagram illustrating a condition where an opposite polarity collision occurs between two transmission devices having the overcurrent limit control units of FIG. 15.

FIG. 16 is a timing diagram illustrating a condition where an opposite polarity collision occurs between two transmission devices having the overcurrent limit control units of FIG. 15. In FIG. 16, a time period indicated by arrows of operation delay corresponds to the delay time caused by the switching time delay unit 255. In FIG. 16, as in the case of FIG. 14, a detection delay (B) is longer than a detection delay (A).

However, the overcurrent limit control unit 220 of Embodiment 2 provides a delay time between entry of the overcurrent limit mode and actual switching of output resistances. Therefore, the output current is kept larger than the overcurrent detection threshold Tc until the facility equipment item B detects the overcurrent after the detection delay (B). That is, according to the transmission device 50 provided with the overcurrent limit control unit 220 of Embodiment 2, variation in time lags in detecting an overcurrent among the new transmission limit circuits can be minimized. As a result, as shown in FIG. 16, even when an opposite polarity collision occurs between two transmission devices 50 having the new transmission limit circuits 100, both transmission devices 50 can detect the overcurrent without fail and thus enter the overcurrent limit mode.

As described above, the transmission device 50 of Embodiment 2 can accurately detect an error of the polarity setting even when data having a wrong polarity setting and data having a correct polarity setting collide with each other on the transmission channel D. In addition, the transmiscircuit unit 52 of Embodiment 2 further includes the switching time delay unit 255, which delays the output of a signal from the state switching and holding unit 153 to the transmission capacity switching unit 161 by the set delay time. Thus, when an opposite polarity collision occurs between two transmission limit circuits 100, both transmission limit circuits 100 can detect the overcurrent without fail even when there are variations in detection delays, which are operation delay times for overcurrent detection, between the transmission limit circuits 100. As a result, the overcurrent limit control can be performed. Other effects are the same as those of Embodiment 1.

Embodiment 3

Figure 17:
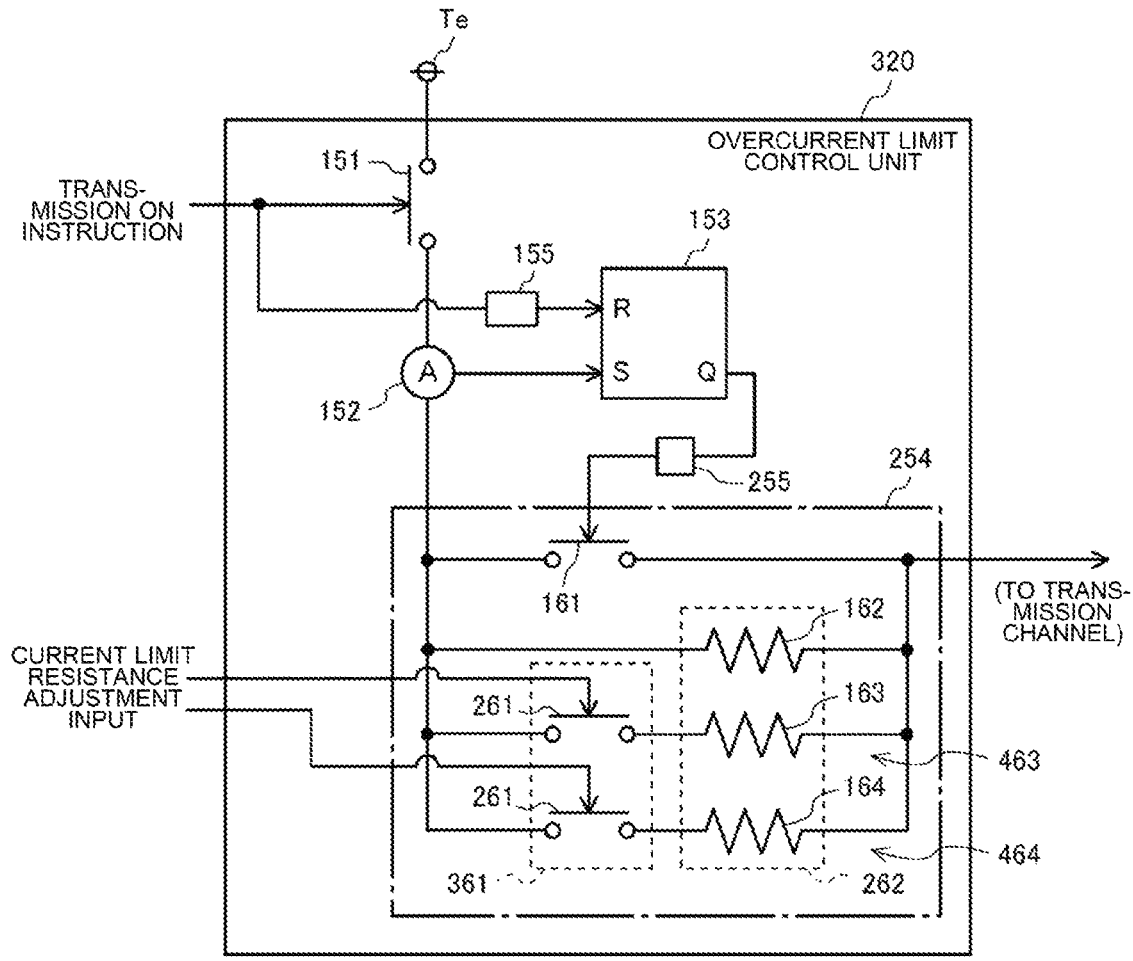
FIG. 17 is a configuration diagram illustrating, as an example, an overcurrent limit control unit of a transmission device according to Embodiment 3 of the present disclosure.
Figure 18:
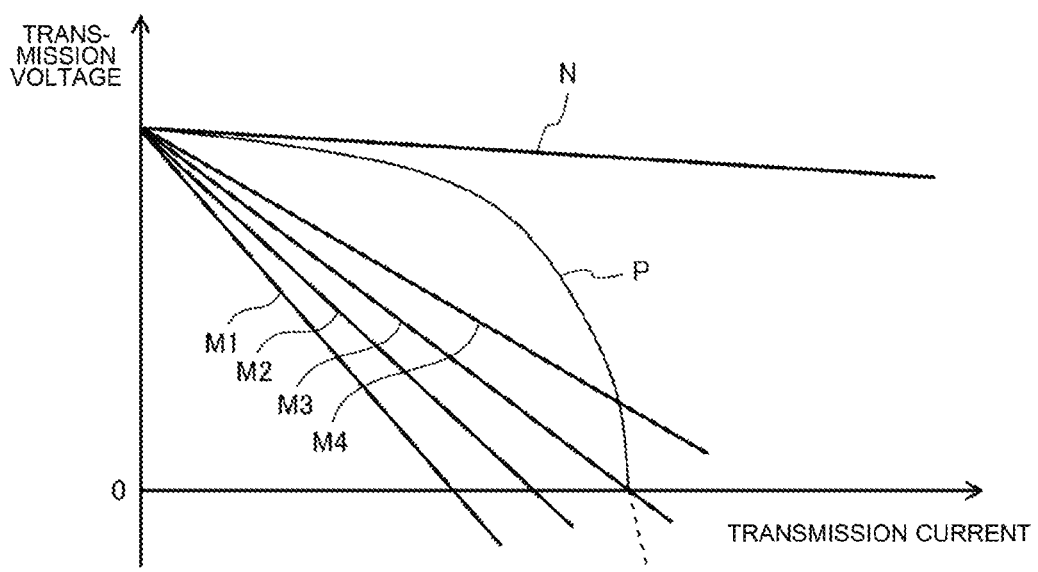
FIG. 18 is a graph illustrating, as an example, an overcurrent limit characteristic of an existing transmission limit circuit and overcurrent limit characteristics of a transmission limit circuit according to Embodiment 3 of the present disclosure.

FIG. 17 is a configuration diagram illustrating, as an example, an overcurrent limit control unit of a transmission device according to Embodiment 3 of the present disclosure. FIG. 18 is a graph illustrating, as an example, an overcurrent limit characteristic of an existing transmission limit circuit and overcurrent limit characteristics of a transmission limit circuit according to Embodiment 3 of the present disclosure. For example, when ICs are manufactured, due to production variations, resistance values in some ICs may be substantially different from a target resistance value, which is an expected resistance value of the current limit resistor 162 in circuit design. When the output resistance in the overcurrent limit mode is greatly different from the target resistance value, a pulse will not be eliminated at an opposite polarity collision and, as a result, the error cannot be detected. In view of this, a transmission device of Embodiment 3 is so configured as to be capable of dealing with a case where the resistance value of the current limit resistor 162 differs from the target resistance value of a transmission limit circuit formed of an IC, for example. The same components as those of Embodiments 1 and 2 will be denoted by the same reference signs, and descriptions thereof will be omitted.

As shown in FIG. 17, an overcurrent limit control unit 320 of Embodiment 3 includes an output resistance adjustment unit 254 configured to adjust an output resistance when the overcurrent detection unit 152 detects an overcurrent. The output resistance adjustment unit 254 includes the transmission capacity switching unit 161, a current limit resistance adjustment unit 361, and a current limit resistance unit 262. The current limit resistance unit 262 has a plurality of current limit resistors, and the current limit resistance adjustment unit 361 has a plurality of transmission capacity adjustment switches 261 formed of transistors, for example.

FIG. 17 shows an example in which the current limit resistance unit 262 includes the current limit resistor 162, an adjustment resistor 163, and an adjustment resistor 164. Thus, the current limit resistance adjustment unit 361 includes two transmission capacity adjustment switches 261 corresponding to the respective adjustment resistors 163 and 164. That is, in the output resistance adjustment unit 254, the transmission capacity switching unit 161, the current limit resistor 162, the transmission capacity adjustment switch 261 and the adjustment resistor 163, and the transmission capacity adjustment switch 261 and the adjustment resistor 164 are connected in parallel.

Here, as shown in FIG. 17, the transmission capacity adjustment switch 261 and the adjustment resistor 163 are connected in series, and form a resistance value adjustment circuit 463, which is an open circuit. Similarly, the transmission capacity adjustment switch 261 and the adjustment resistor 164 are connected in series, and form a resistance value adjustment circuit 464.

In addition, the transmission control circuit 110 of Embodiment 3 has a function of controlling on/off operations of the two transmission capacity adjustment switches 261. That is, the transmission control circuit 110 switches between on and off states of the two transmission capacity adjustment switches 261 depending on a difference between an actual resistance value of the current limit resistor 162 and the target resistance value to adjust the output resistance. Consequently, the transmission limit circuit 100 can achieve optimization of overcurrent limit characteristics as shown in FIG. 18.

With the configuration as illustrated in FIG. 17, the overcurrent limit control unit 320 is capable of forming four kinds of output resistance, including an output resistance using only the current limit resistor 162, an output resistance using the current limit resistor 162 and the adjustment resistor 163 in parallel connection, an output resistance using the current limit resistor 162 and the adjustment resistor 164 in parallel connection, and an output resistance using the current limit resistor 162, the adjustment resistor 163 and the adjustment resistor 164 in parallel connection. With such a configuration, four overcurrent limit characteristics as shown by lines M1 to M4 can be realized. That is, the output resistance can be adjusted to obtain the overcurrent limit characteristic corresponding to line M3 shown in FIG. 18. Here, all or some of current limit resistor 162, the adjustment resistor 163, and the adjustment resistor 164 may have the same resistance value, or all of them may have different resistance values.

In the meantime, FIG. 17 shows an example in which the current limit resistance unit 262 is provided with three current limit resistors, that is, an example in which two resistance value adjustment circuits are connected in parallel to the current limit resistor 162, but the configuration is not limited thereto. In the overcurrent limit control unit 320, only one resistance value adjustment circuit, in which the transmission capacity adjustment switch 261 and a current limit resistor are connected in series, may be connected in parallel to the current limit resistor 162, or three or more resistance value adjustment circuits may be connected in parallel to the current limit resistor 162. In addition, FIG. 17 shows an example in which the overcurrent limit control unit 320 has the switching time delay unit 255, but the configuration is not limited thereto. The overcurrent limit control unit 320 may be formed without the switching time delay unit 255.

As described above, the transmission device 50 of Embodiment 3 is also capable of accurately detecting an error of the polarity setting even when data having a wrong polarity setting and data having a correct polarity setting collide with each other on the transmission channel D. In addition, in the overcurrent limit control unit 320 of Embodiment 3, resistors are connected in parallel to each other on a current output side and the current limit resistance adjustment unit 361 including switching elements is also provided. That is, the output resistance adjustment unit 254 further includes at least one resistance value adjustment circuit, and the resistance value adjustment circuit is connected in parallel to the current limit resistor 162. Thus, the number of current limit resistors to be connected in parallel to the current limit resistor 162 can be changed, and, as a result, the output resistance for the overcurrent limit mode can be adjusted. Consequently, because the number of the current limit resistors can be changed after the IC is manufactured, the output resistance can be also adjusted by using an external switching element or by software of a microcomputer. That is, according to the configuration of Embodiment 3, because output resistance can be adjusted easily after the transmission limit circuit 100 formed of an IC, for example, is designed, easiness of dealing with variation in characteristics and value deviation due to manufacturing process can be improved. Other advantageous effects are the same as those of Embodiments 1 and 2.

The abovementioned embodiments are preferable examples of the transmission device, the air-conditioning apparatus and the air-conditioning system, and the technical scope of the present disclosure is not limited to those embodiments. For example, in the above embodiments, the overcurrent limit control unit is used only on a high-voltage side, but the configuration is not limited thereto. The overcurrent limit control unit may be used only on a low-voltage side or may be used on both high-voltage side and low-voltage side. That is, the current-carrying unit 151 can be used by being connected to at least one of the high-voltage side and the low-voltage side. Note that, some or all functions of the transmission limit circuit 100 can be configured by an arithmetic device, such as a microcomputer, and operation programs that realizes corresponding functions in cooperation with the arithmetic device.

Furthermore, in FIG. 1, the air-conditioning system including two outdoor units, three indoor units 30, and one controller device 40 is illustrated as an example, but the configuration is not limited thereto. The air-conditioning system of each abovementioned embodiment may include one, two, four or more indoor units 30 and two or more controller devices 40. In addition, the air-conditioning system may include two or more sub-outdoor units 20.

The invention claimed is:

1. A transmission device for transmitting and receiving data through a transmission channel, comprising:
a transmission circuit unit configured to transmit data to the transmission channel,
wherein when an overcurrent caused by a simultaneous transmission of data to the transmission channel is detected during data transmission, the transmission circuit unit increases an output resistance, which is a resistance value for an output to the transmission channel, to an resistance value corresponding to a characteristic of a facility equipment item that transmits data to the transmission channel at a same time.

2. The transmission device of claim 1,
wherein the transmission circuit unit includes
a current-carrying unit connected to a high-voltage side or a low-voltage side, and configured to conduct or block a current,
an output resistance adjustment unit provided between the current-carrying unit and the transmission channel, and including a transmission capacity switching unit configured to perform on/off operations and a current limit resistor having a resistance value corresponding to the characteristic of the facility equipment item, the transmission capacity switching unit and the current limit resistor being connected in parallel with each other,
an overcurrent detection unit configured to detect the overcurrent when an output current of the current-carrying unit exceeds an overcurrent detection threshold, and
a state switching and holding unit configured to output a signal for turning the transmission capacity switching unit off when the overcurrent detection unit detects the overcurrent.

3. The transmission device of claim 2,
wherein the transmission circuit unit further includes
a switching time delay unit provided between the state switching and holding unit and the transmission capacity switching unit, and configured to delay an output of a signal from the state switching and holding unit to the transmission capacity switching unit by a set delay time.

4. The transmission device of claim 2,
wherein the output resistance adjustment unit further includes at least one resistance value adjustment circuit in which a transmission capacity adjustment switch and an adjustment resistor are connected in series, and
the resistance value adjustment circuit is connected in parallel to the current limit resistor.

5. The transmission device of claim 2, further comprising:
a transmission control circuit configured to control data transmission by making the current-carrying unit turn on and off.

6. An air-conditioning apparatus comprising:
a heat exchanger;
a fan configured to send air to the heat exchanger; and
the transmission device of claim 1.

7. An air-conditioning system comprising:
a plurality of the air-conditioning apparatuses of claim 6, wherein
at least one of the air-conditioning apparatuses is an indoor unit configured to perform air-conditioning in an air-conditioned space, and
at least one of the air-conditioning apparatuses is an outdoor unit installed outdoors.

8. The air-conditioning system of claim 7 further comprising:
a controller device provided with the transmission device of claim 1, the controller device being configured to integrally manage the plurality of the air-conditioning apparatuses.

* * * * *